(12) United States Patent
Raghavan

(10) Patent No.: US 7,952,397 B2
(45) Date of Patent: May 31, 2011

(54) LOW-SWING DIFFERENTIAL SIGNAL OUTPUT DRIVER WITH WIDE-RANGE SUPPLY VOLTAGE OPERABILITY

(75) Inventor: Bharath Raghavan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 138 days.

(21) Appl. No.: 12/369,152

(22) Filed: Feb. 11, 2009

(65) Prior Publication Data

US 2010/0201340 A1 Aug. 12, 2010

(51) Int. Cl.
*H03B 1/00* (2006.01)
(52) U.S. Cl. ............... 327/108; 327/77; 327/80; 326/82
(58) Field of Classification Search .................. 327/108, 327/77, 80, 99, 199, 333; 326/82–83, 85–87
See application file for complete search history.

(56) References Cited

U.S. PATENT DOCUMENTS

| | | | | |
|---|---|---|---|---|
| 6,429,716 B1 * | 8/2002 | Drapkin et al. | ............... | 327/333 |
| 6,833,746 B2 * | 12/2004 | Drapkin et al. | ............... | 327/333 |
| 7,345,510 B1 * | 3/2008 | Drapkin et al. | ................. | 326/80 |
| 7,619,444 B1 * | 11/2009 | Shaikh et al. | ................... | 326/81 |

* cited by examiner

*Primary Examiner* — An T Luu
(74) *Attorney, Agent, or Firm* — Brake Hughes Bellermann, LLP

(57) ABSTRACT

According to one general aspect, an output driver configured to drive output signals from a core device may include a voltage convertor, an output stage, and a biasing unit. In various embodiments, the output driver is configured to operate in either a core device voltage mode or a high voltage mode. In some embodiments, the voltage convertor may be configured to receive a pair of differential input signals from a core device, wherein a maximum voltage of the input signals is equivalent to a core device voltage, and convert the input signals to a pair of intermediate input signals. In one embodiment, when in high voltage mode, the maximum voltage of the intermediate input signals may be equivalent to a high voltage that is higher than the core device voltage. In some embodiments, the output stage configured to receive the intermediate input signals, and produce a pair of differential output signals having a maximum voltage of, based upon the operating mode of the output driver, either the core device voltage or the high voltage. In various embodiments, the biasing unit configured to provide a biasing current to the output stage, wherein the biasing current is configured to produce a desired common mode voltage within the output stage.

20 Claims, 6 Drawing Sheets

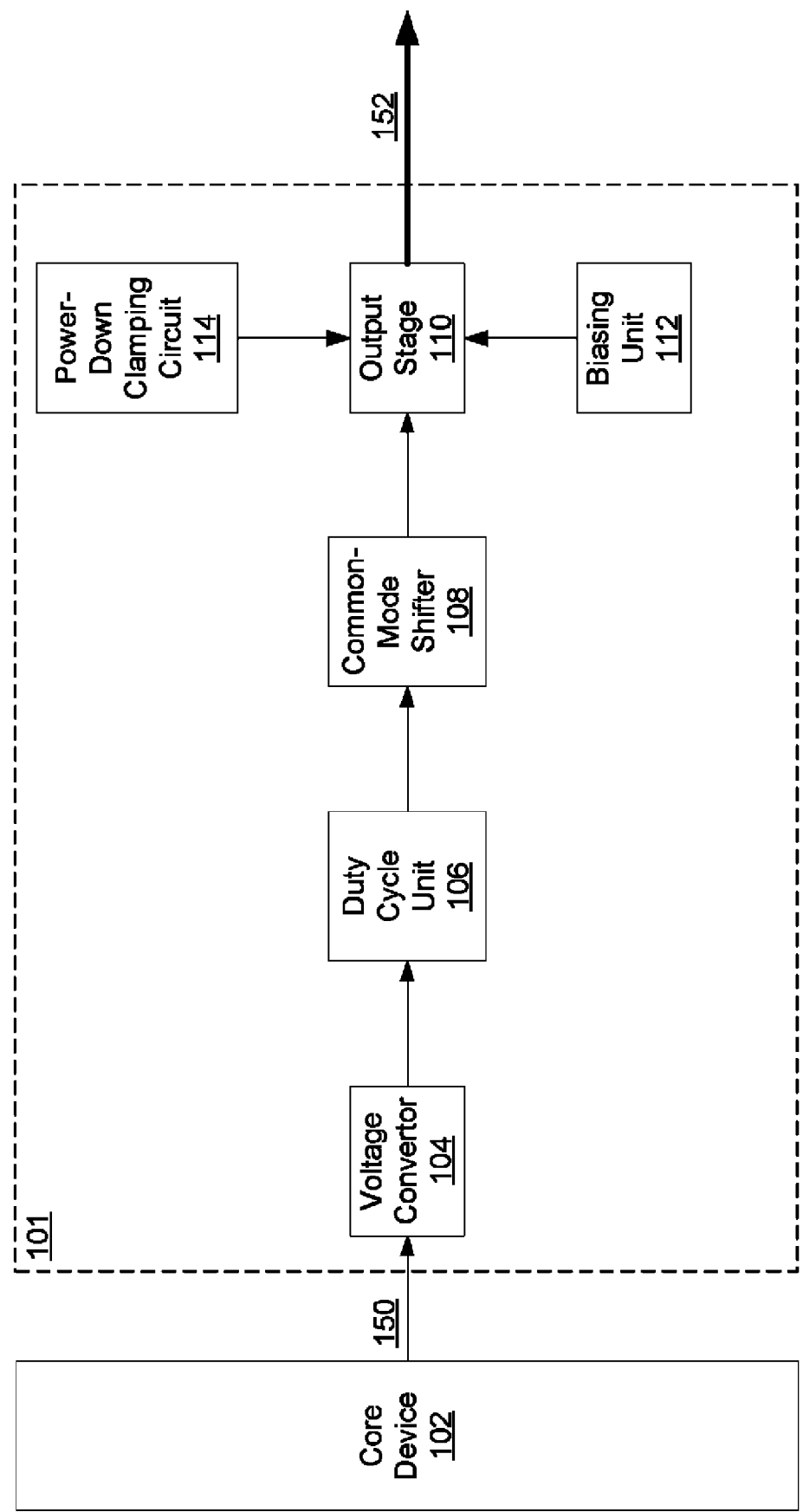

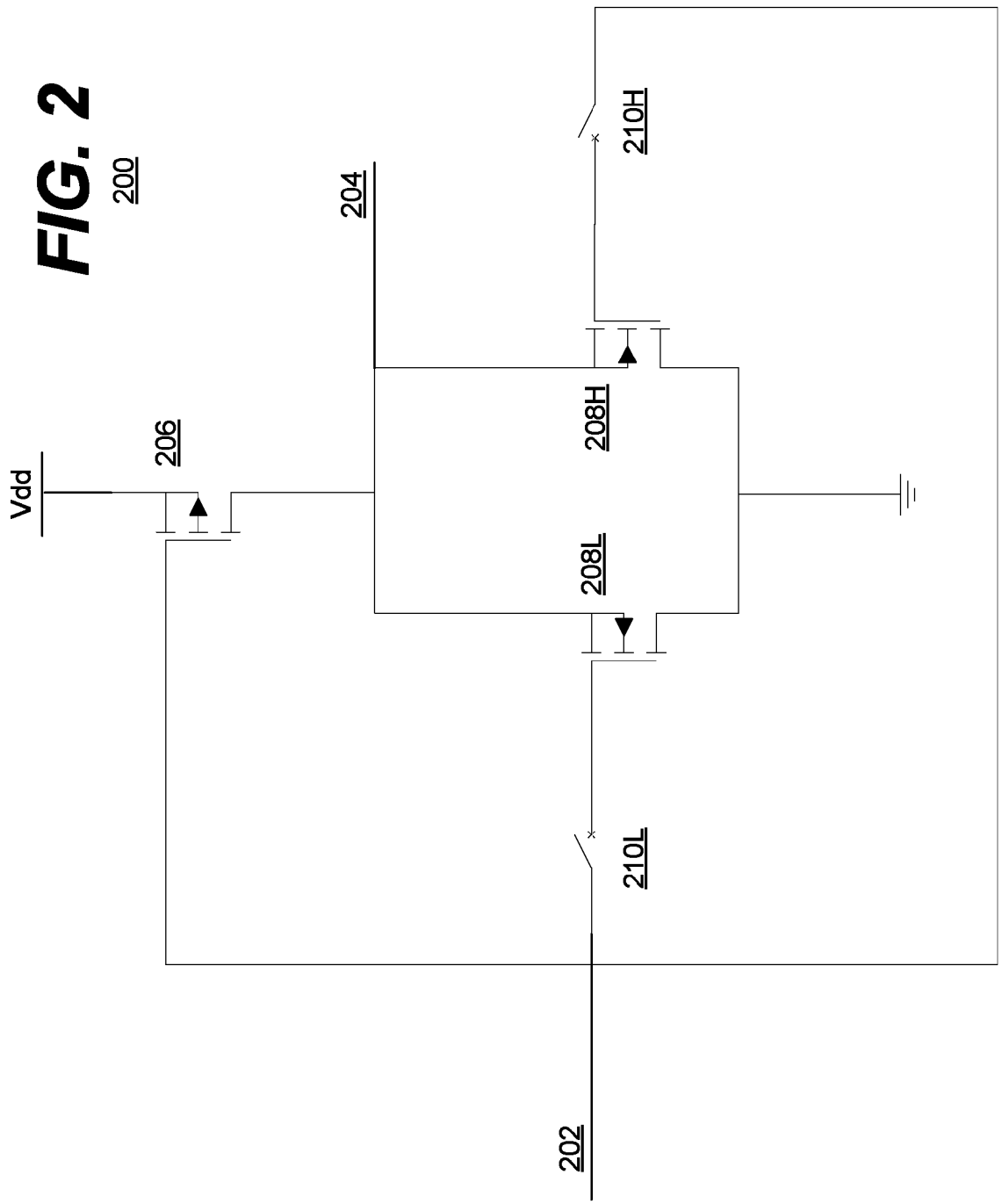

300

500

LOW-SWING DIFFERENTIAL SIGNAL OUTPUT DRIVER WITH WIDE-RANGE SUPPLY VOLTAGE OPERABILITY

TECHNICAL FIELD

This description relates to an output driver, and more specifically to an output driver configured to output voltages of either a core device voltage or a second higher voltage.

BACKGROUND

Differential signaling is generally a technique of transmitting information electrically by means of two complementary signals sent on two separate wires. Often the technique can be used for both analog signaling, as in some audio systems, and digital signaling, for example as in RS-422, RS-485, twisted-pair Ethernet, PCI Express and USB. The opposite technique, which is more common but lacks some of the benefits of differential signaling, is called single-ended signaling.

In the electronics industry, and particularly in portable and mobile devices, there is a continuing tendency to lower the supply voltage in order to save power and reduce unwanted emitted radiation. A low supply voltage, however, frequently causes problems with signaling because it reduces the noise immunity. Differential signaling generally helps to reduce these problems because, for a given supply voltage, it gives twice the noise immunity of a single-ended system.

Low-voltage differential signaling (LVDS) includes a differential signaling system. LVDS frequently uses this difference in voltage between the two wires to encode the information. In general, the transmitter injects a small current (e.g. 3.5 mA) into one wire or the other, depending on the logic level to be sent. The current passes through a resistor, which is often matched to the characteristic impedance of the cable, at the receiving end, then returns in the opposite direction along the other wire. From Ohm's law, the voltage difference may be determined. The receiver frequently senses the polarity of this voltage to determine the logic level. This type of signaling is often referred to as a current loop.

In general, the small amplitude of the signal and the tight electric- and magnetic-field coupling between the two wires reduces the amount of radiated electromagnetic noise and power lost to resistance of the conductors.

SUMMARY

According to one general aspect, an output driver configured to drive output signals from a core device may include a voltage convertor, an output stage, and a biasing unit. In various embodiments, the output driver is configured to operate in either a core device voltage mode or a high voltage mode. In some embodiments, the voltage convertor may be configured to receive a pair of differential input signals from a core device, wherein a maximum voltage of the input signals is equivalent to a core device voltage, and convert the input signals to a pair of intermediate input signals. In one embodiment, when in high voltage mode, the maximum voltage of the intermediate input signals may be equivalent to a high voltage that is higher than the core device voltage. In some embodiments, the output stage is configured to receive the intermediate input signals, and produce a pair of differential output signals having a maximum voltage of, based upon the operating mode of the output driver, either the core device voltage or the high voltage. In various embodiments, the biasing unit is configured to provide a biasing current to the output stage, wherein the biasing current is configured to produce a desired common mode voltage within the output stage.

According to another general aspect, a method of using an output driver may include selecting between at least two modes of operation, a core device voltage mode and a high voltage mode. In various embodiments, the method may include receiving a pair of inputs signals from a core device having a maximum voltage substantially equal to the core device voltage. In some embodiments, the method may include, if the high voltage mode is selected, converting a maximum voltage of the input signals to a high voltage that is greater than the core device voltage. In various embodiments, the method may include generating a biasing current based upon the selected mode, wherein the biasing current is configured to produce a terminal-to-terminal voltage in an output stage and biasing unit that is less than a reliability voltage of the components of the output stage and biasing unit. In another embodiment, the method may include producing a pair of differential output signals based upon the pair of input signals and the biasing signal. In one embodiment, if the selected mode is the core device mode, the pair of differential signals may include a maximum voltage substantially equal to the core device voltage, and if the selected mode is the high voltage mode, the pair of differential signals comprises a maximum voltage substantially equal to the high voltage.

According to another general aspect, an integrated circuit (IC) may include a plurality of core devices and a plurality of output drivers. In various embodiments, each core device may be configured to operate at a core device voltage, and generate at least one differential input signal. In some embodiments, each output driver may be configured to drive the differential input signal from a core device at either the core device voltage or a second voltage that is greater than the core device voltage. In some embodiments, each output driver may include a plurality of output transistors configured to produce a pair of differential output signals having a maximum voltage of either the core device voltage or the second voltage. In some embodiments, the output transistors may have a reliability voltage less than the second voltage.

The details of one or more implementations are set forth in the accompanying drawings and the description below. Other features will be apparent from the description and drawings, and from the claims.

A system and/or method for using an output driver, substantially as shown in and/or described in connection with at least one of the figures, as set forth more completely in the claims.

BRIEF DESCRIPTION OF THE DRAWINGS

FIG. 1 is a block diagram of an example embodiment of a system in accordance with the disclosed subject matter.

In general, like numerals in the Figures indicate like elements.

DETAILED DESCRIPTION

Figure 2B:
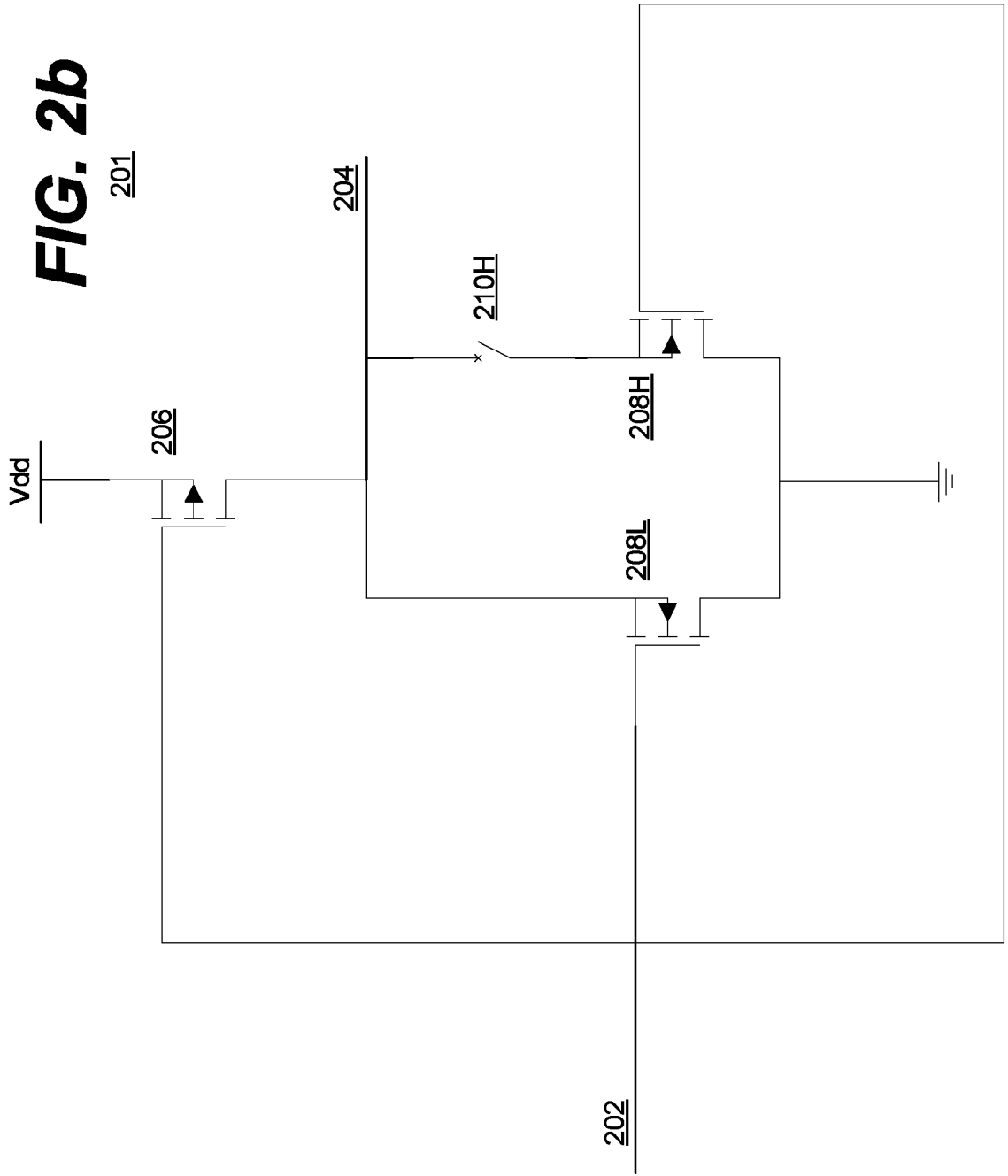
FIG. 2 is a block diagram of an example embodiment of an apparatus in accordance with the disclosed subject matter.

FIG. 1 is a block diagram of an example embodiment of a system 100 in accordance with the disclosed subject matter.

In one embodiment, the system 100 may include a core device 102 and a low-swing differential signal output driver 101. In various embodiments, the core device 102 may produce a pair of differential input signals 150. In some embodiments, these differential input signals 150 may be output to and received by the low-swing differential signal output driver 101. Based upon these differential input signals 150, the low-swing differential signal output driver 101 may generate or produce a pair of differential output signals 152.

In various embodiments, the low-swing differential signal output driver 101 may include a voltage converter 104, an output stage 110, and a biasing unit 112. In another embodiment, the low-swing differential signal output driver 101 may also include one of more of a duty cycle unit 106, a common-mode shifter 108, and a power-down clamping circuit 114.

In various embodiments, the core device 102 may include a plurality of logic functions or functional unit blocks (not explicitly illustrated) that are configured to produce various electrical signals. In one embodiment, some of these signals may include the pair of differential input signals 150. In various embodiments, these logic functions may include transistors or solid-state logical elements that include certain threshold voltages, and/or break-down voltages that are based upon the way in which the transistors or solid-state logical elements are fabricated. For example, in the case on an embodiment that uses complementary metal-oxide-semiconductor (CMOS) transistors, these voltage levels may be directly related to the thickness of the metal-oxide layer of the CMOS transistors. Generally, the thicker the metal-oxide layer the more voltage the devices may withstand and likewise produce.

In the context of this application, the terms "thin" or "thin-oxide transistor or device" refers to solid-state logic elements whose fabrication process is substantially equivalent to the fabrication process used to form the core device 102 transistors (e.g., a 65 nm process for core devices, etc.), and therefore can withstand or produce voltages equivalent to the core device's voltages. For example, in one embodiment, for MOS or CMOS devices the term "thin" may refer to the thickness (or lack thereof) of the metal-oxide layer of the core device's 102 transistors. The voltages of the core device's 102 transistors may also be referred to as a "first voltage", "the core device's voltage" or a "low voltage".

Conversely, the terms "thick" or "thick-oxide transistor or device", in this context, are relative terms measured against the dimensions created via core device's 150 fabrication process. In such an embodiment, a "thick transistor" may include a substantially thicker (e.g., 2 or 3 times as thick) metal-oxide layer than the core device's 102 transistor's metal-oxide layer (e.g., transistors with minimum dimension of 280 nm, or devices belonging to a process 1 or 2 generations behind the core device's 102 process level minimum dimensions, etc.). As such, a thick transistor may be capable of withstanding or producing a greater amount of voltage. In this context, this greater voltage may be referred to as a "second voltage" or a "high voltage". In some embodiments, this high voltage may be at least 10% greater than the low voltage.

It is understood that if transistors or solid-state devices are exposed to voltage levels above their design tolerances, the useful operating life of the devices may be greatly reduced. It is further understood that if transistors or solid-state devices are exposed to voltage levels greatly above their design tolerances a rather quick operational failure may occur. For example, in one embodiment, the thin transistors may expect an average operational lifetime if their terminal-to-terminal voltage ($V_{tt}$) is kept at less than 1.2V. Whereas, a thick transistor may expect an average operational lifetime if their terminal-terminal voltage ($V_{tt}$) is kept at less than 1.8V or 2.5V. In various embodiments, the average operational lifetime may be between 5 to 10 years. In this context, the term "reliability voltage" may refer to the voltage above which the device begins to experience a degradation and reduction in its expected operating lifespan. Although, it is understood that the above are merely a few illustrative examples to which the disclosed subject matter is not limited.

In various embodiments, the core device 102 may produce the pair of differential input signals 150 at a first or core device voltage. In some embodiments, this voltage may include a maximum voltage level of 1V or 1.2V; although, it is understood that the above is merely one illustrative example to which the disclosed subject matter is not limited.

In various embodiments, the low-swing differential signal output driver 101 (hereafter, "output driver 101") may be configured to operate in either a low (or core device) voltage mode and a high (or second) voltage mode. In one embodiment, when operating in the low voltage mode, the output driver 101 may produce a pair of differential output signals 152 having a maximum voltage substantially equal to the core device or low voltage. In some embodiments, when operating in the high voltage mode, the output driver 101 may produce a pair of differential output signals 152 having a maximum voltage substantially equal to the second or high voltage. In one specific embodiment, in high voltage mode the pair of differential output signals 152 may include a common-mode voltage of 1.2V with a single-ended peak-to-peak amplitude of at least 250 mV and a maximum power supply voltage of either 1.8V or 2.5V It is understood that all values expressed herein may include conventional tolerance limits, and need not be exact. It is also understood that the numerical values herein are merely a few illustrative examples to which the disclosed subject matter is not limited.

In one embodiment, the output driver 101 may include a voltage convertor 104. In various embodiments, the voltage convertor 104 may be configured to receive the pair of differential input signals 150, which include a maximum voltage substantially equivalent to the core device 102 voltage, as described above. In one embodiment, the voltage convertor 104 may be configured to, when in the high voltage mode, convert the maximum voltage of the input signal 150 to the high voltage (e.g. from 0-1V to 0-1.8V, etc.).

In various embodiments, the output driver 101 may include a duty cycle unit 106. In some embodiments, the duty cycle unit 106 may be configured to receive the intermediate signal produced by the voltage convertor 104. In one embodiment, the duty cycle unit 106 may be configured to adjust the duty cycle of the intermediate signal such that the intermediate signal conforms to a predetermined duty cycle tolerance. For example, in one embodiment, a LVDS driver is expected to produce signals of roughly (e.g. ±5%) a 50% duty cycle. Although, it is understood that the above is merely one illustrative example to which the disclosed subject matter is not limited.

In some embodiments, the output driver 101 may include a common-mode shifter 108. In such an embodiment, the common-mode shifter 108 may be configured to adjust the common-mode voltage of the intermediate signals. That is the voltage from which the differential signals diverge. In one embodiment, the common-mode shifter 108 may be configured to convert the intermediate signal to an output level that maintains the device terminal-to-terminal voltage ($V_{tt}$) to within the reliability voltage ($V_{rel}$) of the transistors or elements of the output stage 110. In various embodiments, this $V_{rel}$ of transistors or elements of the output stage 110 may be equivalent to the core device voltage, as described below. In some embodiments, depending upon the common-mode of the input intermediate signal, either the minimum or maximum voltage of the input intermediate signal may be adjusted or shifted depending upon whether the output common-mode is closer to the high voltage or ground voltage.

In some embodiments, the output driver 101 may include an output stage 110. In various embodiments, the output stage 110 may be configured to receive the input signals and produce a pair of differential output signals 152 having a maximum voltage of less than or equal to either the core or low voltage or the high voltage, depending upon the respective operating mode of the output driver 101. Conventionally, the output stage 110 may include thick transistors having a reliability voltage ($V_{rel}$) equal to or greater than the high voltage. In one embodiment of the disclosed subject matter, the output stage 110 may include thin transistors having a $V_{rel}$ equal to or greater than the core or low voltage but less than that of the thick transistors.

In one embodiment, the output driver 101 may include a biasing unit 112. In various embodiments, the biasing unit 112 may be configured to produce a desired common mode voltage within the output stage 10. In some embodiments, the desired common mode voltage may be substantially 1.2v; although, it is understood that the above is merely one illustrative example to which the disclosed subject matter is not limited.

In some embodiments, the output driver 101 may include a power-down clamping circuit 114. In various embodiments, the power-down clamping circuit 114 may be configured to maintain a fixed terminal-to-terminal voltage across any thin-oxide devices (e.g. those included by the output stage 110) when the output driver 101 is powered down (e.g. in a sleep mode, or turned off, etc.). In some embodiments, the power-down clamping circuit 114 may be configured to apply a fixed voltage across all (or a sub-set thereof) of the terminals of the thin-oxide core devices (e.g. gate, source, and drain of thin-oxide CMOS transistor), such that no terminal-to-terminal voltage exceeds the device's reliability voltage.

FIG. 2 is a block diagram of an example embodiment of an apparatus or voltage convertor 200 in accordance with the disclosed subject matter. In various embodiments, the apparatus or voltage convertor 200 may be included by the voltage convertor 104 of FIG. 1. As described above, in various embodiments, the voltage convertor 200 may be configured to convert a first maximum voltage of the input signal 202 to a second maximum voltage of an output or intermediate signal 204. As described above, in various embodiments, the input and output signals may include a pair of differential signals.

In one embodiment, the voltage converter 200 may include pull up element or p-channel MOS (PMOS) transistor 206, and a pair of pull-down elements or n-channel MOS (NMOS) transistors 208L and 208H. In some embodiments, the pull-up element 206 and the pull-down elements 208L and 208H may be mismatched, such that correct operation for voltage convertor 200 for digital signaling under different power supply voltage regimes is enabled.

In various embodiments, pull-down transistors 208L and 208H may be sized differently to allow different pulldown strengths when each of the respective transistors 208L or 208H is active in the circuit under different power supply voltage regimes. In some embodiments, the voltage convertor 200 may be configured to operate in either a low voltage mode (e.g. 1.2V) or a high voltage mode (e.g. 1.8V). In various embodiments, the voltage Vdd may be substantially equal to the high voltage (e.g. 1.8V). Although, it is understood that the above is merely one illustrative example to which the disclosed subject matter is not limited.

In one embodiment, when the circuit is in a low voltage mode (e.g. 1.2V) the switch 210L may be closed and the transistor 208L may be active in the circuit. Likewise, switch 210H may be open and the transistor 208H may be inactive in the circuit. In such an embodiment, the transistor 208L may be sized to allow a maximum voltage at the output substantially equal to the low voltage (e.g. 1.2V), such that a voltage swing between 0 and the low voltage is possible. Although, it is understood that the above is merely one illustrative example to which the disclosed subject matter is not limited.

Conversely, in various embodiments, when the circuit is in a high voltage mode (e.g. 1.8V) the switch 210L may be open and the transistor 208L may be inactive in the circuit. Likewise, switch 210H may be closed and the transistor 208H may be active in the circuit. In such an embodiment, the transistor 208H may be sized to allow a maximum voltage at the output substantially equal to the high voltage (e.g. 1.8V), such that a voltage swing between 0 and the high voltage is possible. Although, it is understood that the above is merely one illustrative example to which the disclosed subject matter is not limited.

Alternatively, in another embodiment, in apparatus or voltage convertor 201 the location of switch 210H may be as depicted in FIG. 2b. In such an embodiment, the transistor 208H may be sized such that when the switch 210H is closed a maximum voltage is allowed at the output substantially equal to the high voltage (e.g., 1.8V, etc.), such that a voltage swing between 0 and the high voltage is possible.

In various embodiments, an analog tuning technique or circuit may be implemented instead of the voltage convertor 200. In such an embodiment, the analog tuning circuit may be configured to provide a number of output voltages or a continuous range of output voltages. Although, it is understood that the above is merely one illustrative example to which the disclosed subject matter is not limited.

Figure 3:
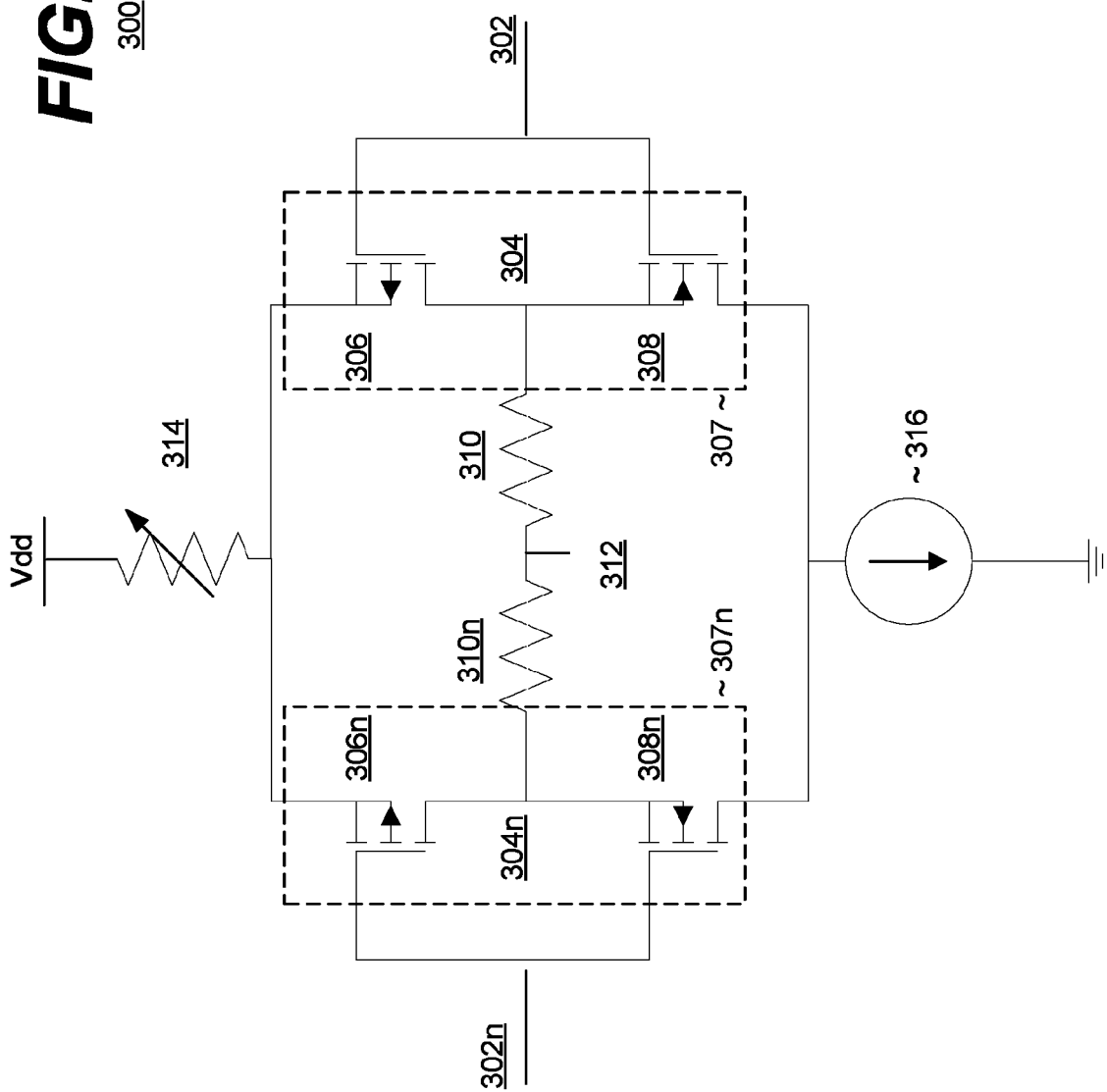
FIG. 3 is a block diagram of an example embodiment of an apparatus in accordance with the disclosed subject matter.

FIG. 3 is a block diagram of an example embodiment of an apparatus or output stage 300 in accordance with the disclosed subject matter. In various embodiments, the apparatus or output stage 300 may be included by the output stage 110 of FIG. 1. As described above, output stage 300 may be configured to receive the input or intermediate signals 302 and 302n and produce a pair of differential output signals 304 and 304n having a maximum voltage of either the core or low voltage or the high voltage, depending upon the respective operating mode of the output driver.

In conventional embodiments, the output stage may consist of a pull-push pair conventionally implemented using thick-oxide high-voltage devices. In such an embodiment, the thick-oxide devices may include reliability voltages equal or greater to the high voltage level (e.g. 1.8V, 2.4V, etc.). However in the illustrated embodiment, the output stage 200 may include a push-pull pair by means of thin-oxide core devices. In such an embodiment, the thin-oxide devices may include reliability voltages substantially equal to the low or core voltage level (e.g. 1.2V, etc.).

In such an embodiment, the output stage 300 may include a bias current 316 configured to achieve a desired common-mode voltage (at node 312) and output amplitude. Furthermore, in one embodiment, the output stage 300 may include an optional common-mode feedback circuit (including elements 310, 310n, and 314) configured to maintain the common-mode voltage (at node 312) within a set of predetermined specifications or tolerances. In various embodiments, the implementation of these elements may vary depending on whether the desired output common-mode is closer to ground or to the power supply rail, or other considerations.

In one embodiment, the output stage 300 may include a pair of complementary buffers 307 and 307n configured in a push-pull arrangement. In some embodiments, the buffers 307 and 307n may be implemented or include CMOS transistors 306 & 308 and 306n and 308n, respectively. In such an embodiment, each of these transistors 306, 306n, 308, and 308n may include three terminals: a source terminal, a gate terminal, and a drain terminal. In such an embodiment, these transistors 306, 306n, 308, and 308n may include a reliability voltage ($V_{rel}$) less than or substantially equal to the low or core voltage (e.g. 1.2V, etc.), and less than the high voltage. In various embodiments, the terminal-to-terminal voltages ($V_{tt}$) experienced by each transistor 306, 306n, 308, 308n may be configured to be less than the reliability voltage (e.g. $\leq$1.2V, etc.) while providing a maximum voltage equal to or less than the high voltage (in high voltage mode) (e.g. 1.8V, 2.5V, etc.).

In one embodiment, the output stage 300 may include an optional common-mode feedback circuit configured to maintain the common-mode voltage (at node 312) within a set of predetermined specifications or tolerances (e.g. substantially 1.2V, etc.). In one embodiment, this common-mode feedback circuit may include the complementary resistors 310 and 310n, and a variable resistor 314. In various embodiments, the variable resistor 314 may be controlled by a reference voltage, for example an off-chip or known thermally controlled circuit (not illustrated).

Figure 4C:
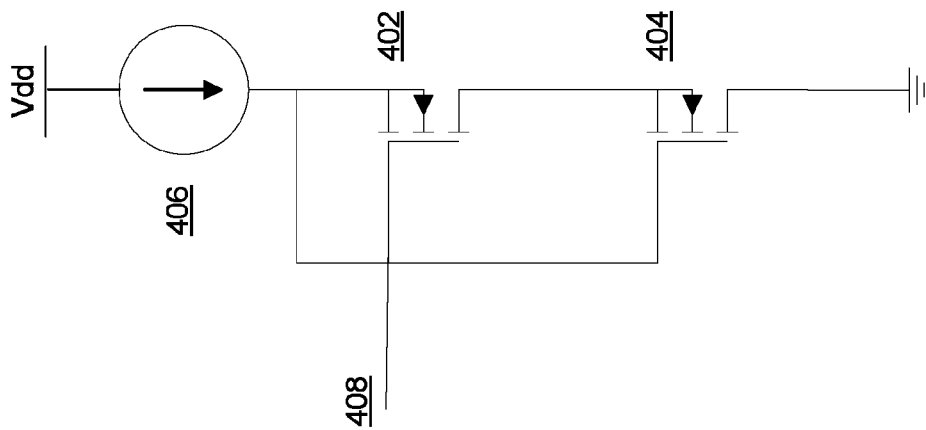
FIG. 4 is a block diagram of an example embodiment of an apparatus in accordance with the disclosed subject matter.
Figure 4B:
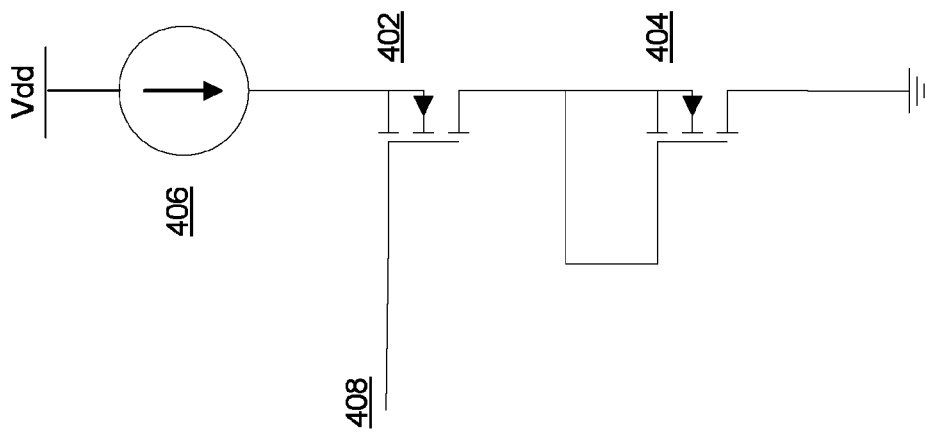
Figure 4A:
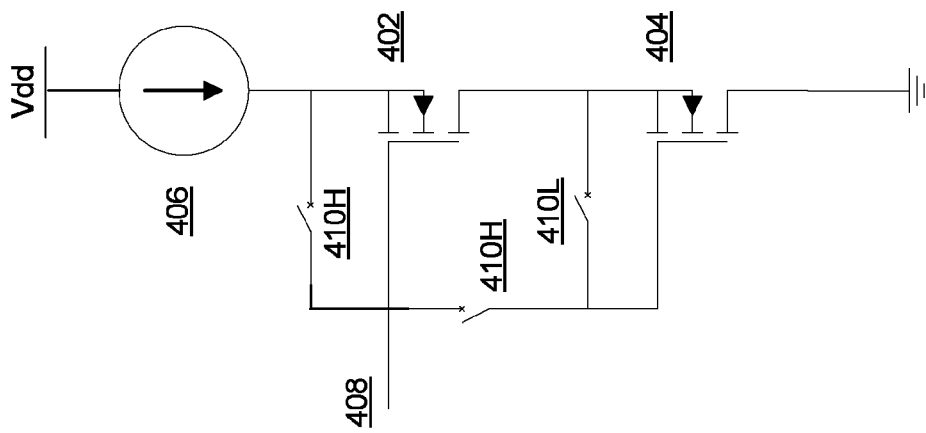

FIG. 4 is a block diagram of an example embodiment of an apparatus or biasing unit 400 in accordance with the disclosed subject matter. In various embodiments, the apparatus or biasing unit 400 may be included by the biasing unit 112 of FIG. 1, and/or may provide the biasing current 316 of FIG. 3. As described above, biasing unit 400 may be configured to provide a biasing current to the output stage. In various embodiments, the biasing current may be configured to produce a desired common mode voltage (e.g. 1.2V, etc.) within the output stage.

In one embodiment, the biasing unit 112 may include an upper transistor 402 and a lower transistor 404. In various embodiments, these transistors 402 and 404 may include NMOS transistors including three terminals: a gate terminal, a source terminal, and a drain terminal.

In one embodiment, the biasing unit 400 may receive input reference current 406. In such an embodiment, the input reference current 406 may be produced by a band-gap source or, in another embodiment, a current mirror. Although, it is understood that the above are merely a few illustrative examples to which the disclosed subject matter is not limited.

In some embodiments, the input voltage 408 may include either the low/core voltage (e.g. 1.2V, etc.) or the high voltage (e.g. 1.8V, etc.), if the biasing unit 400 is operating in the low voltage mode or high voltage mode, respectively. Likewise, the biasing unit 400 may include switch 410H which may be opened and switch 410L, which may be closed if the biasing unit 400 is operating in the low voltage mode. Conversely, the switch 410L may be opened and switch 410H may be closed if the biasing unit 400 is operating in high voltage mode. As such, when the biasing unit 400 operates in high voltage mode the simplified circuit of FIG. 4b may result. Conversely, in low voltage mode the simplified circuit of FIG. 4c may result.

In either case or operating mode, the biasing unit 400 may include a biasing diode portion and a cascode device portion. The diode connection configuration for 404 may change based upon which mode is employed.

FIG. 4b illustrates an embodiment in which the biasing unit 400 is configured to operate in high voltage (e.g. 1.8V, etc.) mode. In such an embodiment, the lower transistor 404 is configured as the biasing diode with its gate terminal coupled with its drain terminal. Furthermore in this embodiment, the upper transistor 402 may be configured to operate as the cascode device portion, with its gate receiving the input cascode voltage 408.

FIG. 4c illustrates an embodiment in which the biasing unit 400 is configured to operate in low or core voltage (e.g. 1.2V, etc.) mode. In such an embodiment, the lower transistor 404 may be configured as a biasing diode, with its gate terminal coupled with the drain terminal of upper transistor 408.

In various embodiments, the upper transistor 402 and lower transistor 404 may be configured such that the terminal-to-terminal voltages experienced are less than the reliability voltage. Furthermore, in various embodiments, the upper transistor 402 and lower transistor 404 may include thin-oxide transistors with reliability voltages less than or substantially equal to the core or low voltage (e.g. 1.2V, etc.)

Figure 5:
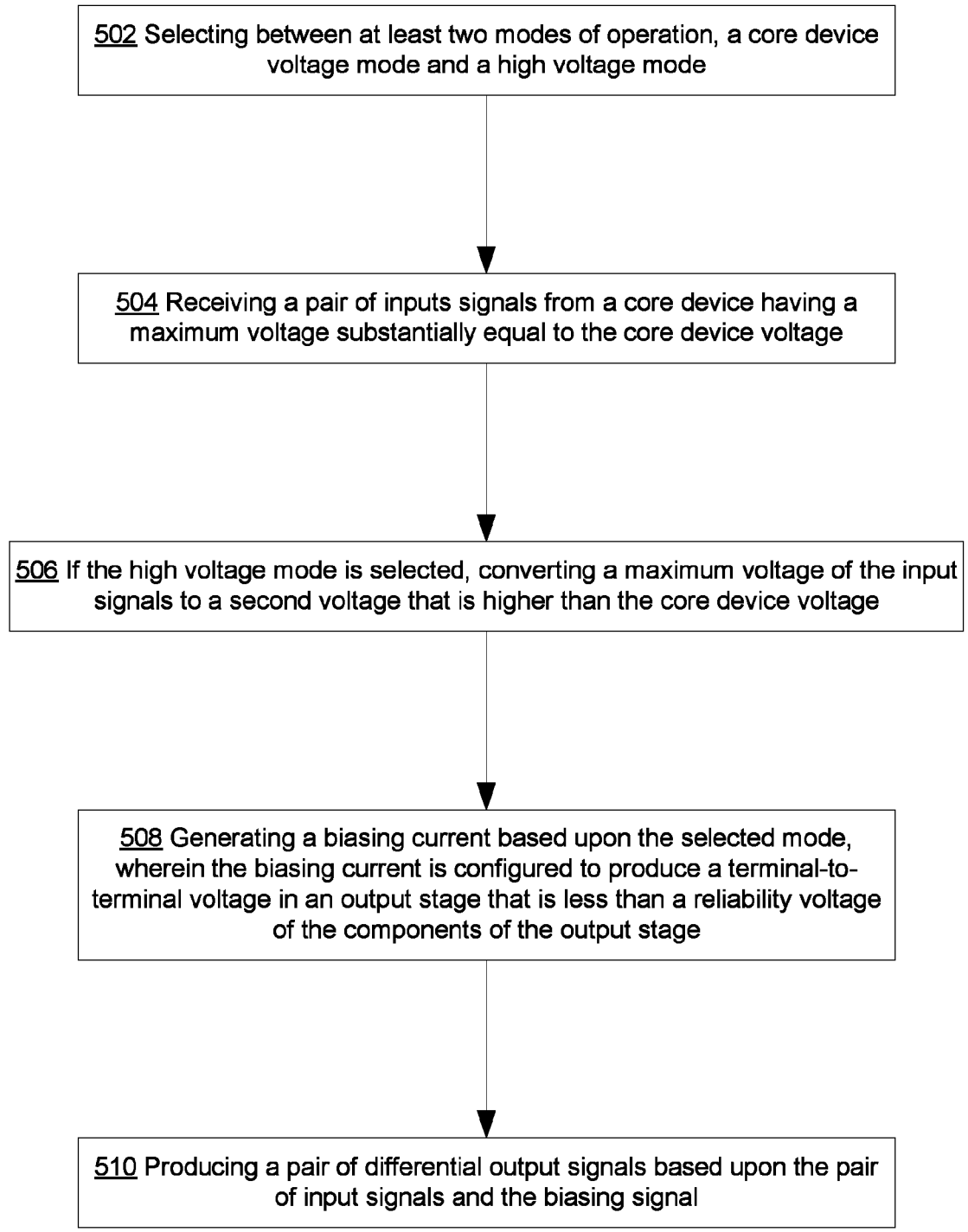
FIG. 5 is a flow chart of an example embodiment of a technique in accordance with the disclosed subject matter.

FIG. 5 is a flow chart of an example embodiment of a technique 500 in accordance with the disclosed subject matter. In various embodiments, the technique 500 may be performed by the system of FIG. 1, the apparatuses of FIGS. 2, 3 and 4, as described above.

Block 502 illustrates that, in one embodiment, a selection may be made between at least two modes of operation, a core device voltage mode and a high voltage mode, as described above. In one embodiment, the difference between the core device voltage and the high voltage may be greater than 10%, as described above. In various embodiments, the core device voltage may be substantially 1.2V and high or second voltage may be 1.8V or greater; although, it is understood that the above is merely one illustrative example to which the disclosed subject matter is not limited. In some embodiments, selecting may include receiving a selection signal that places the output driver in either the core voltage mode or the high voltage mode, as described above. In various embodiments, the selection may be made by setting a voltage rail (e.g. Vdd, etc.) to either the core device voltage or the high voltage, as described above.

Block 504 illustrates that, in one embodiment, a pair of inputs signals may be received from a core device, wherein the input signals have a maximum voltage substantially equal to the core device voltage, as described above. In various embodiments, receiving the input signals may include adjusting a duty cycle of the input signals such that the input signals conform to a predetermined duty cycle tolerance, as described above. In one embodiment, the action(s) illustrated by this block may be performed or represented by the input signals 150, voltage convertor 104, or duty cycle unit 106 of FIG. 1, or the input signals 202 or voltage convertor 200 of FIG. 2, as described above.

Block 506 illustrates that, in one embodiment, if the high voltage mode is selected, a maximum voltage of the input signals may be converted to a second voltage that is higher than the core device voltage, as described above. In one embodiment, the action(s) illustrated by this block may be performed or represented by the voltage convertor 104 of FIG. 1, or the voltage convertor 200 of FIG. 2, as described above.

Block 508 illustrates that, in one embodiment, a biasing current may be generated based upon the selected mode, as described above. In various embodiments, the biasing current may be configured to produce a terminal-to-terminal voltage in an output stage that is less than a reliability voltage of the components of the output stage, as described above.

In one embodiment, generating a biasing current may include employing an upper transistor and a lower transistor arranged as a cascode pair to generate the biasing current. In various embodiments, generating may include when the core device voltage mode is selected, coupling the gate of the lower transistor to the drain of the upper transistor, as described above. In another embodiment, generating may include, when the high voltage mode is selected, coupling the gate of the lower transistor to the drain of the lower transistor, as described above.

In one embodiment, the action(s) illustrated by this block may be performed or represented by the biasing unit 112 of FIG. 1, or the biasing current 316 of FIG. 3, or the biasing unit 400, transistors 402 and 404 of FIG. 4, as described above.

Block 510 illustrates that, in one embodiment, a pair of differential output signals may be produced based upon the pair of input signals and the biasing signal, as described above. In various embodiments, if the selected mode is the core device mode, the pair of differential signals may include a maximum voltage substantially equal to or less than the core device voltage. In another embodiment, if the selected mode is the high voltage mode, the pair of differential signals may include a maximum voltage substantially equal to or less than the second voltage, as described above.

In various embodiments, producing may include employing a pair of complementary buffers configured in a push-pull arrangement, as described above. In such an embodiment, producing may also include employing a common-mode feedback circuit configured to maintain a common mode of the pair of differential output signals within a predetermined tolerance, as described above. In various embodiments, employing the pair of complementary buffers may include receiving the input signals, and producing the pair of differential output signals, as described above.

In some embodiments, producing a pair of differential output signals may include employing transistors having a metal-oxide thickness substantially equivalent to a metal-oxide thickness of a device that produced the input signals, as described above. In another embodiment, producing may include employing transistors having a reliability voltage less than the high or second voltage, as described above.

In one embodiment, the action(s) illustrated by this block may be performed or represented by the output stage 110 of FIG. 1, or the output stage 300 or the transistors 306, 306n, 308, and/or 308n of FIG. 3, as described above. In various embodiments, the output signals illustrated by this block may be represented by the output signals 152 of FIG. 1 or the output signals 304 and 304n of FIG. 3, as described above.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g. in a machine-readable storage device or in a propagated signal, for execution by, or to control the operation of, data processing apparatus, e.g. a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g. an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g. EPROM, EEPROM, and flash memory devices; magnetic disks, e.g. internal hard disks or removable disks; magneto-optical disks; and CD-ROM and DVD-ROM disks. The processor and the memory may be supplemented by, or incorporated in special purpose logic circuitry.

Implementations may be implemented in a computing system that includes a back-end component, e.g. as a data server, or that includes a middleware component, e.g. an application server, or that includes a front-end component, e.g. a client computer having a graphical user interface or a Web browser through which a user can interact with an implementation, or any combination of such back-end, middleware, or front-end components. Components may be interconnected by any form or medium of digital data communication, e.g. a communication network. Examples of communication networks include a local area network (LAN) and a wide area network (WAN), e.g. the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A driver configured to operate in either a core device voltage mode or a high voltage mode, the driver comprising;
   a voltage convertor configured to:
      receive at least one input signal from a core device, wherein a voltage of the input signal is substantially equal to a core device voltage, and
      convert the input signal to a corresponding intermediate input signal,
      wherein, when in high voltage mode, the voltage of the intermediate input signal is substantially equal to a high voltage that is higher than the core device voltage; and
   an output stage configured to:
      receive the intermediate input signals, and
      produce at least one output signal having a voltage of, based upon the operating mode of the driver, either the core device voltage or the high voltage.

2. The driver of claim 1 wherein the output stage includes transistors having a reliability voltage less than the high voltage.

3. The driver of claim 1 wherein the high voltage is at least 10% greater than the core device voltage.

4. The driver of claim 1 wherein the biasing unit comprises:
a lower transistor and an upper transistor, each having a drain and a gate, and coupled as a pair of cascode and biasing diode transistors;
wherein the transistors are configured such that:
when the driver operates in a low voltage mode, the gate of the lower transistor is electrically coupled with the drain of the upper transistor, and
when the driver operates in a high voltage mode, the gate of the lower transistor is electrically coupled with the drain of the lower transistor.

5. The driver of claim 1 wherein the output stage comprises:
a pair of complementary buffers configured in a push-pull arrangement, wherein the pair of complementary buffers are configured to receive the at least one intermediate signal and produce the pair of differential output signals; and
a common-mode feedback circuit configured to maintain a common mode of a pair of differential output signals within a predetermined tolerance.

6. The driver of claim 5 wherein the pair of complementary buffers includes transistors having a reliability voltage less than or substantially equal to the core device voltage.

7. The driver of claim 1 wherein the driver includes transistors having at least three terminals and a reliability voltage;
wherein the driver further comprises a power-down clamping circuit configured to, when the driver is in a low power mode, apply a predetermined voltage across the terminals of the transistors such that the terminal-to-terminal voltage of each transistor is below the reliability voltage.

8. The driver of claim 2 wherein the core device voltage is substantially equal to or less than 1.2 volts;
wherein the high voltage is substantially equal to or greater than 1.5 volts; and
wherein the reliability voltage is substantially equal to or less than 1.2 volts.

9. The driver of claim 1 wherein the output stage includes transistors having a gate thickness substantially equivalent to a gate thickness of the core devices.

10. A method of using an driver comprising:
selecting between at least two modes of operation, a core device voltage mode and a high voltage mode;
receiving at least one inputs signal from a core device having a voltage substantially equal to the core device voltage;
if the high voltage mode is selected, converting the voltage of the input signal to a high voltage that is greater than the core device voltage;
generating a biasing current based upon the selected mode;
producing at least one output signal based upon the input signal and the biasing signal; and
wherein, if the selected mode is the core device mode, the output signal comprises a voltage substantially equal to the core device voltage, and
if the selected mode is the high voltage mode, the output signal comprises a voltage substantially equal to the high voltage.

11. The method of claim 10 wherein selecting includes receiving a selection signal that places the driver in either the core voltage mode or the high voltage mode.

12. The method of claim 10 wherein the high voltage includes a voltage at least 10% greater than the core device voltage.

13. The method of claim 10 wherein generating a biasing current includes:
employing an upper transistor and a lower transistor arranged as a cascode pair to generate the biasing current;
wherein both the upper and lower transistors include a gate terminal and a drain terminal;
wherein, when the core device voltage mode is selected, coupling the gate of the lower transistor to the drain of the upper transistor; and
wherein, when the high voltage mode is selected, coupling the gate of the lower transistor to the drain of the lower transistor.

14. The method of claim 10 wherein producing the output signal comprises:
employing a pair of complementary buffers configured in a push-pull arrangement; and
employing a common-mode feedback circuit configured to maintain a common mode of a pair of differential output signals within a predetermined tolerance; and
the output signal includes the pair of differential output signals.

15. The method of claim 14 wherein the pair of complementary buffers includes transistors having a reliability voltage less than or substantially equal to the core device voltage.

16. The method of claim 10 wherein the core device voltage is substantially equal to or less than 1.2 volts; and
wherein the high voltage is substantially equal to or greater than 1.8 volts.

17. The method of claim 10 wherein producing the output signal includes employing transistors having a metal-oxide thickness substantially equivalent to a metal-oxide thickness of a device that produced the input signal.

18. An integrated circuit (IC) comprising:
a plurality of core devices, each core device configured to:
operate at a core device voltage, and
generate at least one input signal;
a plurality of output drivers, each output driver configured to:
drive the input signal from the core device at either the core device voltage or a second voltage that is greater than the core device voltage; and each output driver includes:
a plurality of output transistors configured to produce at least one output signal having a voltage substantially equal to either the core device voltage or the second voltage; and
wherein the output transistors have a reliability voltage less than the second voltage.

19. The IC of claim 18 wherein each output driver comprises:
a voltage convertor configured to:
receive a at least one input signal from a core device, wherein a voltage of the input signal is substantially equal to the core device voltage, and
convert the input signal to at least one intermediate input signal,
wherein, when in high voltage mode, the voltage of the intermediate input signal is substantially equal to a second voltage that is higher than the core device voltage; and
an output stage configured to:
receive the intermediate input signal, and
produce at least one output signal having a voltage of either the core device voltage or the second voltage.

20. The IC of claim 18 wherein the core device voltage is substantially equal to or less than 1.2 volts;
wherein the second voltage is substantially equal to or greater than 1.8 volts; and
wherein the reliability voltage is substantially equal to or less than 1.2 volts.

* * * * *

UNITED STATES PATENT AND TRADEMARK OFFICE
CERTIFICATE OF CORRECTION

PATENT NO. : 7,952,397 B2
APPLICATION NO. : 12/369152
DATED : May 31, 2011
INVENTOR(S) : Bharath Raghavan Page 1 of 1

It is certified that error appears in the above-identified patent and that said Letters Patent is hereby corrected as shown below:

In column 11, line 40, in claim 10, delete "an" and insert -- a --, therefor.

In column 11, line 43, in claim 10, delete "inputs" and insert -- input --, therefor.

In column 12, line 47, in claim 19, delete "a at least" and insert -- at least --, therefor.

Signed and Sealed this
Sixth Day of September, 2011

David J. Kappos
*Director of the United States Patent and Trademark Office*